(12) United States Patent
Benoliel (10) Patent No.: US 10,191,234 B2
(45) Date of Patent: Jan. 29, 2019

(54) ASSEMBLY AND PACKAGING METHOD AND SYSTEM FOR OPTICAL COMPONENTS

(75) Inventor: Eli Benoliel, Or Akiva (IL)

(73) Assignee: OTX Ltd., Or Akiva (IL)

(*) Notice: Subject to any disclaimer, the term of this patent is extended or adjusted under 35 U.S.C. 154(b) by 398 days.

(21) Appl. No.: 13/807,938

(22) PCT Filed: Jun. 30, 2011

(86) PCT No.: PCT/IL2011/000522
§ 371 (c)(1),
(2), (4) Date: Jan. 2, 2013

(87) PCT Pub. No.: WO2012/001693
PCT Pub. Date: Jan. 5, 2012

(65) Prior Publication Data
US 2013/0108222 A1 May 2, 2013

Related U.S. Application Data

(60) Provisional application No. 61/360,541, filed on Jul. 1, 2010.

(51) Int. Cl.
*G02B 6/42* (2006.01)
*G02B 6/36* (2006.01)
*H05K 13/04* (2006.01)

(52) U.S. Cl.
CPC .......... *G02B 6/423* (2013.01); *G02B 6/36* (2013.01); *H05K 13/04* (2013.01); *Y10T 29/49002* (2015.01); *Y10T 29/4913* (2015.01)

(58) Field of Classification Search
CPC .... G02B 6/423; G02B 6/4243; G02B 6/4253; G02B 6/4257
See application file for complete search history.

(56) References Cited

U.S. PATENT DOCUMENTS

| | | | |
|---|---|---|---|
| 6,220,764 B1 | 4/2001 | Kato et al. | |
| 6,530,698 B1 | 3/2003 | Kuhara et al. | |
| 7,543,993 B2* | 6/2009 | Blauvelt | G02B 6/4201 385/14 |
| 2002/0057876 A1 | 5/2002 | Yamabayashi et al. | |

(Continued)

FOREIGN PATENT DOCUMENTS

| | | |
|---|---|---|
| DE | 4301236 | 3/1994 |
| EP | 1978387 | 10/2008 |
| WO | WO 2012/001693 | 1/2012 |

OTHER PUBLICATIONS

International Preliminary Report on Patentability dated Oct. 26, 2012 From the International Preliminary Examining Authority Re. Application No. PCT/IL2011/000522.

(Continued)

*Primary Examiner* — Ryan Lepisto
*Assistant Examiner* — Erin Chiem (57) ABSTRACT

A method of aligning an optical fiber with an optical component in a micro-optical sub-assembly, comprises: providing a groove in the micro-sub-assembly in alignment with the optical component; and placing the optical fiber in the groove, thereby aligning the optical fiber with the optical component. In this way a placement tool with an accuracy of 50 microns can be used to place an optical fiber with an alignment accuracy of one micron.

3 Claims, 10 Drawing Sheets

(56) References Cited

U.S. PATENT DOCUMENTS

2003/0086652 A1* 5/2003 Boudreau .............. G02B 6/423
385/49
2004/0184753 A1 9/2004 Teramura et al.

OTHER PUBLICATIONS

International Search Report and the Written Opinion dated Dec. 19, 2011 From the International Searching Authority Re. Application No. PCT/IL2011/000522.
Written Opinion dated Jul. 11, 2012 From the International Preliminary Examining Authority Re. Application No. PCT/IL2011/000522.
Notification of Office Action dated Jun. 3, 2016 From the State Intellectual Property Office of the People's Republic of China Re. Application No. 201180033181.2 and Its Translation Into English.
Notification of Office Action dated Nov. 8, 2017 From the State Intellectual Property Office of the People's Republic of China Re. Application No. 201180033181.2. (5 Pages).
Translation of Notification of Office Action dated Nov. 8, 2017 From the State Intellectual Property Office of the People's Republic of China Re. Application No. 201180033181.2. (4 Pages).
Notification of Office Action and Search Report dated Dec. 23, 2014 From the State Intellectual Property Office of the Peoples Republic of China Re. Application No. 201180033181.2 and Its Translation Into English.
Translation Dated Jan. 14, 2015 of Notification of Office Action and Search Report dated Dec. 23, 2014 From the State Intellectual Property Office of the People's Republic of China Re. Application No. 201180033181.2.
Notification of Office Action dated Apr. 3, 2014 From the State Intellectual Property Office of the People's Republic of China Re. Application No. 201180033181.2 and Its Translation Into English.
Search Report dated Apr. 3, 2014 From the State Intellectual Property Office of the People's Republic of China Re. Application No. 201180033181.2 and Its Translation Into English.
Notification of Office Action and Search Report dated Dec. 23, 2014 From the State Intellectual Property Office of the Peoples Republic of China Re. Application No. 201180033181.2.
Examination Report Under Sections 12 & 13 of the Patents Act, 1970 and the Patents Rules, 2003 dated Feb. 20, 2018 From the Government of India, Intellectual Property India, Patents, Designs, Trade Marks, Geographical Indications Re. Application No. 157/MUMNP/2013. (6 Pages).
Decision of Rejection dated Mar. 19, 2018 From the State Intellectual Property Office of the People's Republic of China Re. Application No. 201180033181.2. (5 Pages).
Translation Dated Apr. 10, 2018 of Decision of Rejection dated Mar. 19, 2018 From the State Intellectual Property Office of the People's Republic of China Re. Application No. 201180033181.2. (9 Pages).

* cited by examiner

ASSEMBLY AND PACKAGING METHOD AND SYSTEM FOR OPTICAL COMPONENTS

RELATED APPLICATIONS

This application is a National Phase of PCT Patent Application No. PCT/IL2011/000522 having International filing date of Jun. 30, 2011, which claims the benefit of priority under 35 U.S.C. § 119(e) of U.S. Provisional Patent Application No. 61/360,541 filed on Jul. 1, 2010. The contents of the above applications are all incorporated by reference as if fully set forth herein in their entirety.

FIELD AND BACKGROUND OF THE INVENTION

The present invention relates to an assembly or packaging method and system for optical components and, more particularly, but not exclusively to semiconductor lasers where accurate alignment is required.

The accuracy with which component placing is required in the field of semiconductor lasers depends on the wavelength of the laser concerned. The shorter the wavelength the more accurately the components need to be placed.

Short laser wavelengths are required for a variety of applications. Thus lasers may be used for communications or to draw structures on silicon wafers. For 1.5 µm features, relatively easy to handle laser light of 436 nm is sufficient. However as features shrink below 1 µm, diffraction around the mask edges tends to lead to fuzzy lines and ineffective wafer components. This problem can be solved by using shorter wavelength lasers but then parts have to be more accurately aligned when constructing the laser.

Likewise with communications, shorter wavelength lasers can provide greater bandwidth.

Known techniques for constructing the laser components place the components on the PCB, but have to use expensive specialist machines for very accurate placing. The tools are expensive. The general technique that is used is to place the laser on the PCB, turn it on, find a maximum in the laser beam and then accurately place an optical fiber at the beam maximum.

The present embodiments seek to address the above issue and provide a simpler alternative for the placing of the fiber, given the placement of the laser diode.

SUMMARY OF THE INVENTION

According to one aspect of the present invention there is provided a method of aligning an optical fiber with an optical component in a micro-optical sub-assembly, comprising:

providing a groove in the micro-sub-assembly in alignment with the optical component; and placing the optical fiber in the groove, thereby aligning the optical fiber with the optical component.

In an embodiment, the groove is a v-shaped groove.

In an embodiment, the groove is a v-shaped groove having an apex, the method comprising pressing the fiber firmly into the apex.

In an embodiment, wherein the groove is a v-shaped groove cut into a length of silicon.

In an embodiment, the optical component is a laser diode.

In an embodiment, the optical component has a wavelength which is at or below 365 nm.

In an embodiment, the optical component is a photodetector.

In an embodiment, the optical component is a laser diode combined with a photo detector.

In an embodiment, the groove and the optical component are placed relative to each other such that the pressing of the fiber firmly into the apex aligns the fiber with the optical component to an accuracy of substantially one micron.

According to a second aspect of the present invention there is provided a method of providing a micro-optical sub-assembly, comprising:

providing a groove in a surface of the optical sub-assembly and an optical component aligned therewith; and placing an optical fiber in the groove, thereby aligning the optical fiber with the optical component.

In an embodiment, the groove is a v-shaped groove.

In an embodiment, the groove is a v-shaped groove having an apex, the method comprising pressing the optical fiber firmly into the apex.

The method may comprise mounting the micro-optical sub-assembly on a printed circuit board to form an optical sub-assembly.

The method may comprise extending the optical fiber into a ferule provided on the printed circuit board for onward connection to external components.

In an embodiment, the optical component is a laser diode.

In an embodiment, the optical component has a wavelength which is at or below 365 nm.

In an embodiment, the optical component is a photodetector.

In an embodiment, the optical component is a laser diode combined with a photo detector.

According to a third aspect of the present invention there is provided a micro-optical sub-assembly comprising:

an optical component;

a groove aligned with the optical component; and an optical fiber aligned with the optical component by placement in the groove.

In an embodiment, the groove is a v-shaped groove.

In an embodiment, the groove is a v-shaped groove having an apex and the optical fiber is recessed into the apex.

An embodiment may be placed on a printed circuit board and the optical fiber extending into a ferule for onward connection to external components.

In an embodiment, the optical component is one member of the group comprising a laser diode, a photo-detector and a laser diode together with a photo-detector.

In an embodiment, the groove is cut into a silicon base.

Unless otherwise defined, all technical and scientific terms used herein have the same meaning as commonly understood by one of ordinary skill in the art to which this invention belongs. The materials, methods, and examples provided herein are illustrative only and not intended to be limiting.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Implementation of the method and/or system of embodiments of the invention can involve performing or completing selected tasks manually, automatically, or a combination thereof.

Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in order to provide what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

The present embodiments comprise providing a laser diode, photo-detector or other optical component, aligned with a groove. Then the optical fiber is placed in the groove. The groove may be a v-shaped groove having an apex and the fiber falls into the apex, aligning itself with the optical component.

The required alignment accuracy is 1 micron. The prior art provides a tool that precisely places the fiber to 1 micron accuracy. The present embodiments may use a placement tool with an accuracy of 50 microns since it merely needs to find the groove and then the groove guides the fiber to the necessary accuracy of 1 micron.

Although accurate placement of the laser and alignment with the groove are still required, this can be provided using conventional equipment. The obviation of the need for accurate placement of the fiber provides a considerable cost saving in terms of the tools required.

The principles and operation of an apparatus and method according to the present invention may be better understood with reference to the drawings and accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Figure 1:
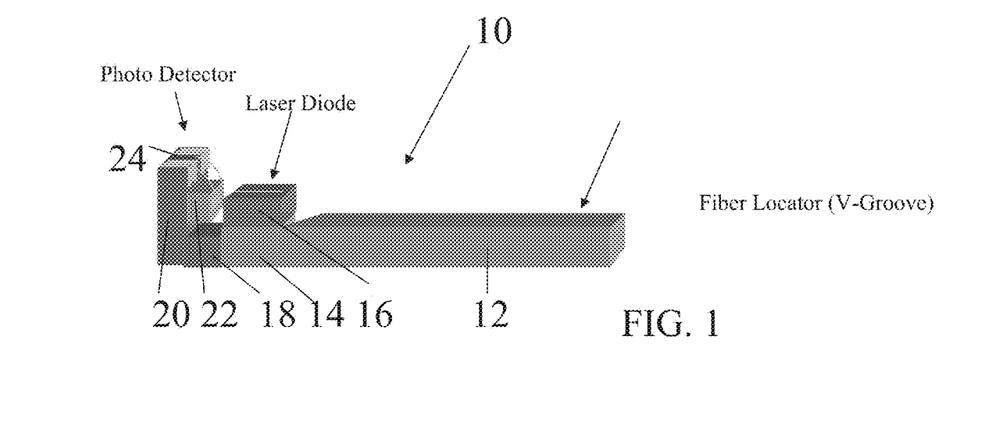
FIG. 1 is a simplified schematic diagram illustrating a micro-transmission optical sub-assembly (μTOSA) according to the present embodiments.

Reference is now made to FIG. 1 which is an isometric schematically illustrating a micro-transmission optical sub-assembly (μTOSA). The sub-assembly 10 comprises a silicon fiber locator element 12 in which is etched a v-shaped groove. A holder, 14, abuts the locator element. Mounted on the holder 14 is laser diode 16. A space element 18 provides and defines a precise separation space behind laser diode 16, and a further holder 20 abuts onto the space element 18. On the front of the further holder 20 a monitoring photo-detector 22 is mounted. Electrical contacts 24 are provided on the further holder 20. Wire bonding 26 connects the optical components to contacts 24.

The holder 14 plays a part in distributing of heat from the laser and may be mounted with a heat sink, as discussed in greater detail below. Holes may be inserted in the holder for connection to the heat sink.

Figure 2:
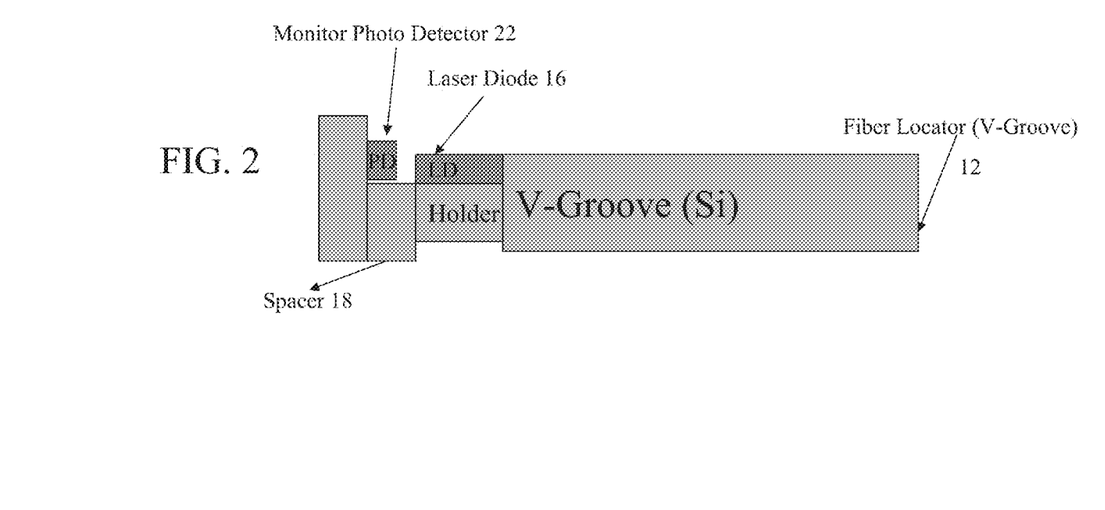
FIG. 2 shows a side view of the device of FIG. 1.

FIG. 2 is a side view along the μTOSA 10 of FIG. 1 The parts are the same as those in FIG. 1 and are given the same reference numerals.

Figure 3:
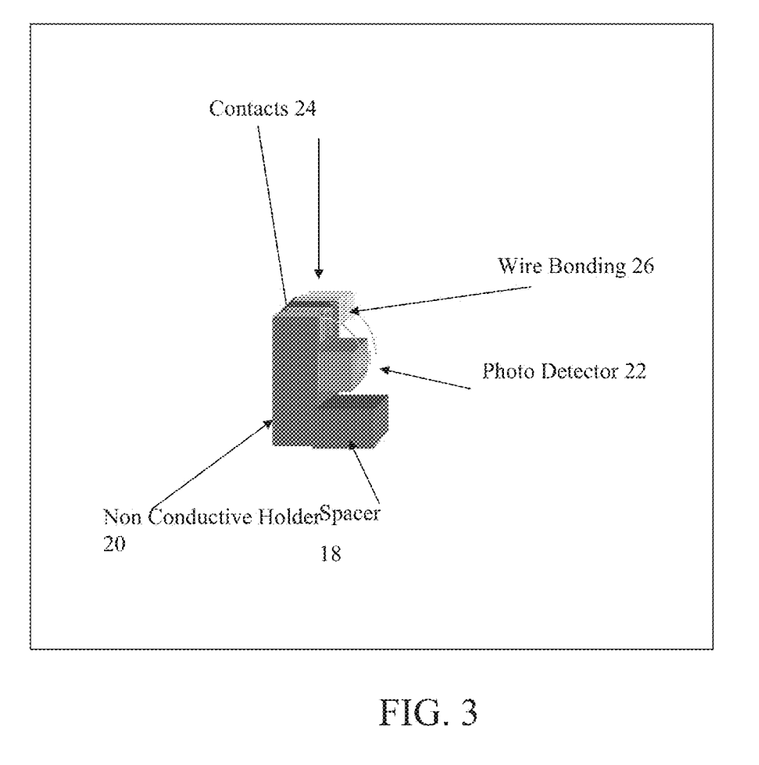
FIG. 3 is a side view of the photo-detector assembly of the device of FIG. 1.

FIG. 3 shows in greater detail the construction of the photo-detector sub-assembly of FIG. 1. Again, the parts are the same as those in FIG. 1 and are given the same reference numerals.

Figures 4A, 4B:
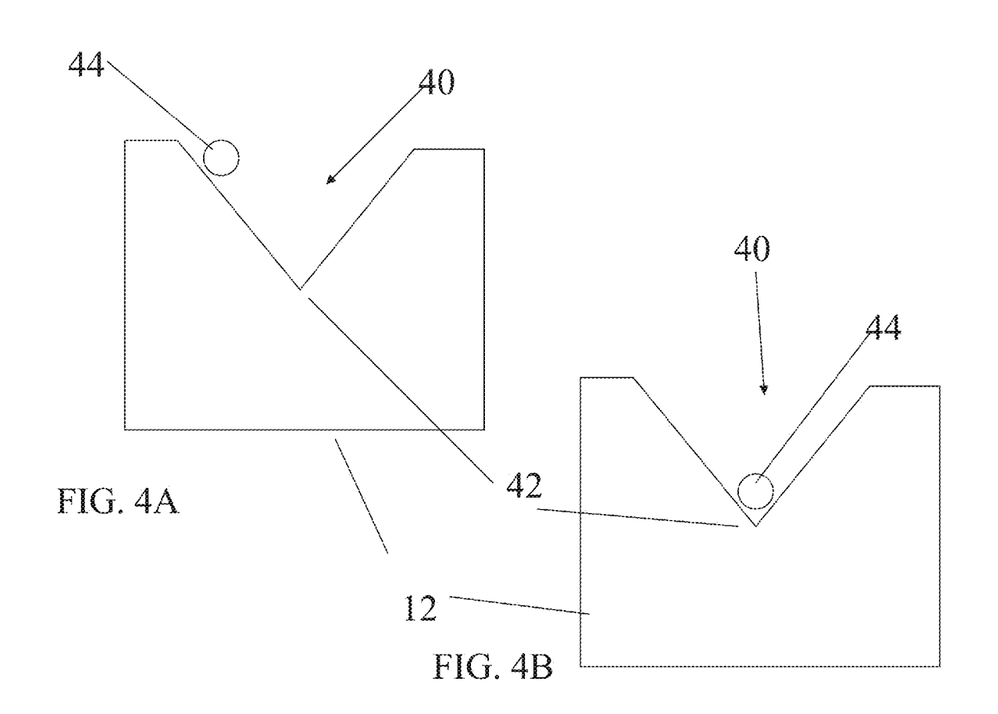
FIG. 4A is a simplified diagram illustrating an alignment groove according to the present embodiments and shows an optical fiber placed over the groove and inaccurately aligned.
FIG. 4B is a simplified diagram showing how the optical fiber of FIG. 4A has fallen to the apex of the groove, thus being accurately aligned.

Reference is now made to FIG. 4A which is a simplified transverse cross section of the locator element 12, showing v-shaped groove 40 etched therein. The groove 40 has apex 42 Optical fiber 44 is placed on the groove by an inaccurate placing tool.

FIG. 4B shows how optical fiber 44 is brought into accurate alignment by falling into apex 42 of the groove 40.

Figure 5:
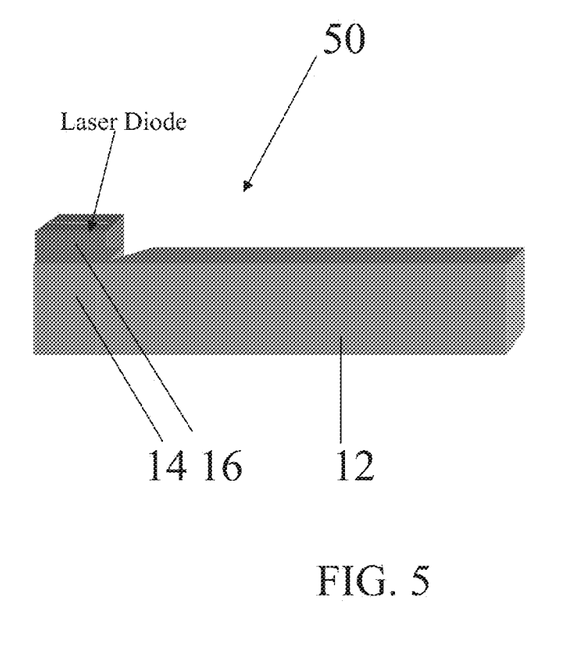
FIG. 5 is a simplified diagram showing a variation of the device of FIG. 1 in which the laser diode is provided but the photo-detector is omitted.

Reference is now made to FIG. 5 which shows a further embodiment of a μTOSA. The optical diode assembly of FIG. 3 may be dispensed with to provide a three piece unit 50 comprising laser 16, groove locator 12 and laser holder 14.

Figures 6, 7:
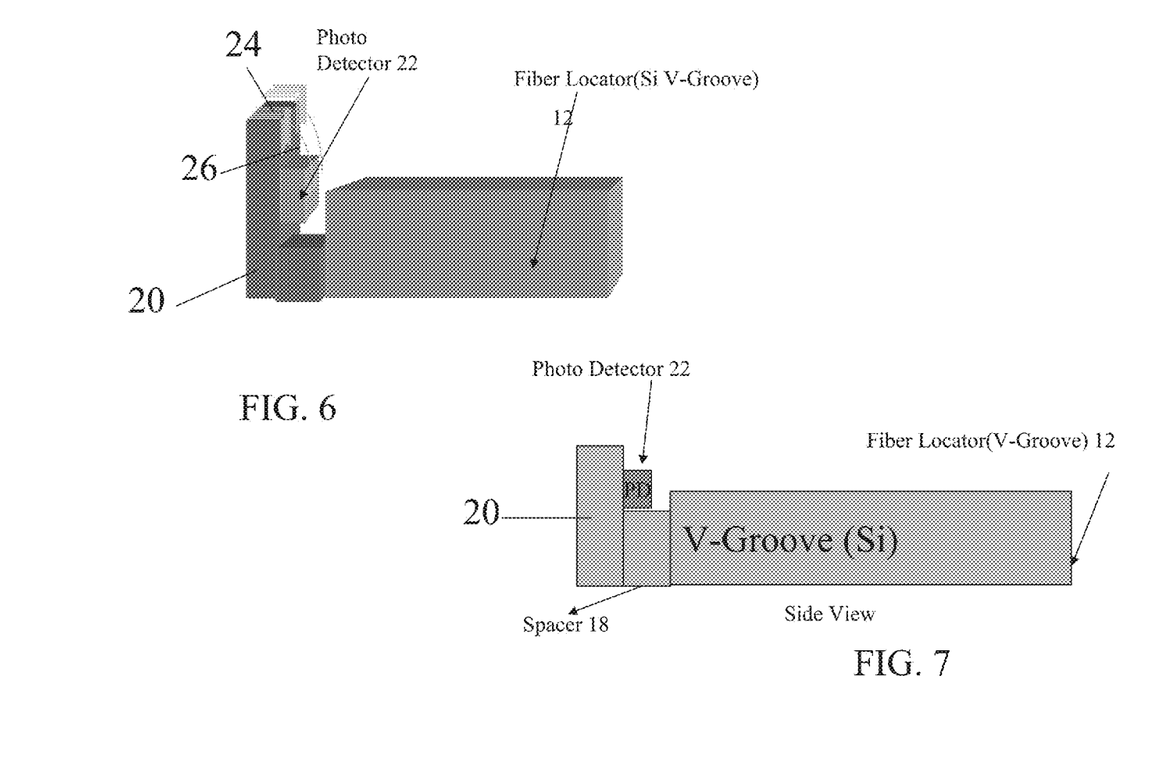
FIG. 6 is a simplified diagram illustrating micro-receiving optical sub-assembly (μROSA) according to the present embodiments.
FIG. 7 is a side view of the embodiment of FIG. 6.

Reference is now made to FIG. 6, which is a simplified diagram illustrating a micro-receiving optical sub-assembly (μROSA). Parts that are the same as shown in FIG. 1 are given the same reference numerals and are not described again except as necessary to describe the present embodiment. A receiving optical sub-assembly simply detects incoming laser light and thus has a photo-detector 22 in place of the laser diode. The photo-detector 22 is aligned with the groove which extends along holder 12 and is spaced therefrom due to spacer 18, but otherwise the construction is as described above.

FIG. 7 is a longitudinal side view of the μROSA of FIG. 6. The detail of the photodetector sub-assembly is as shown in FIG. 3.

Figure 8:
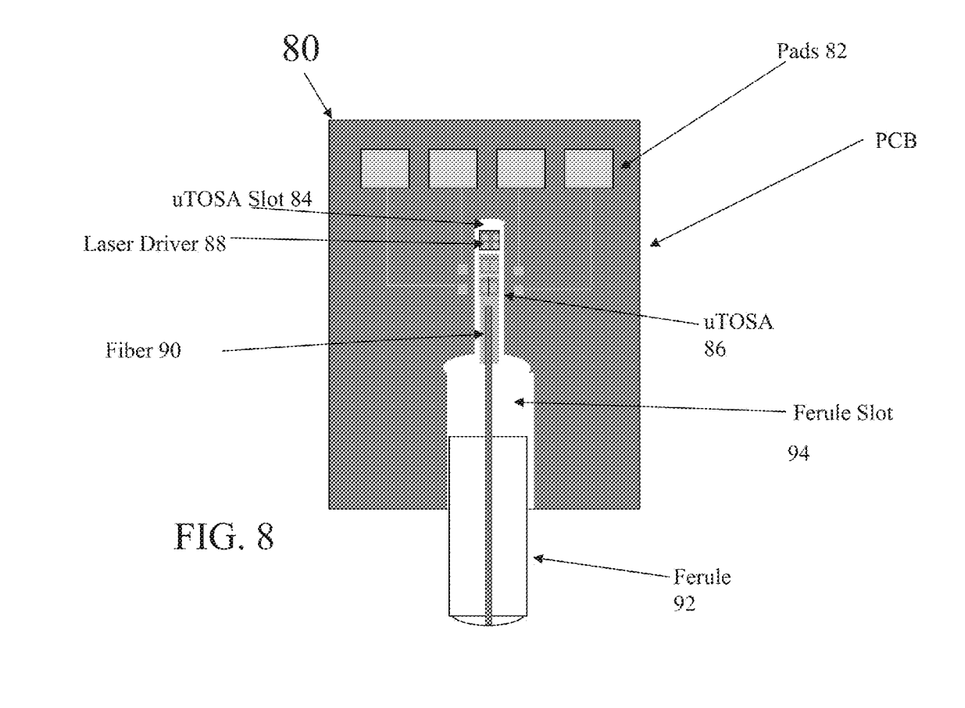
FIG. 8 is a simplified diagram illustrating a transmission optical sub-assembly (TOSA) according to an embodiment of the present invention incorporating the μTOSA of FIG. 1 in a PCB.

Reference is now made to FIG. 8, which is a simplified diagram of a transmission optical sub-assembly onto which the μTOSA of FIGS. 1-4B, or of FIG. 5 is inserted. PCB 80 has connection pads 82 for electrical connections to external equipment. A μTOSA slot 84 accepts μTOSA 86 and laser driver 88. Fiber 90 extends from ferule 92 and is aligned along the groove so that it lines up with the laser inside the μTOSA 86. Ferule 92 is placed in ferule slot 94 in the PCB 80.

Figure 9:
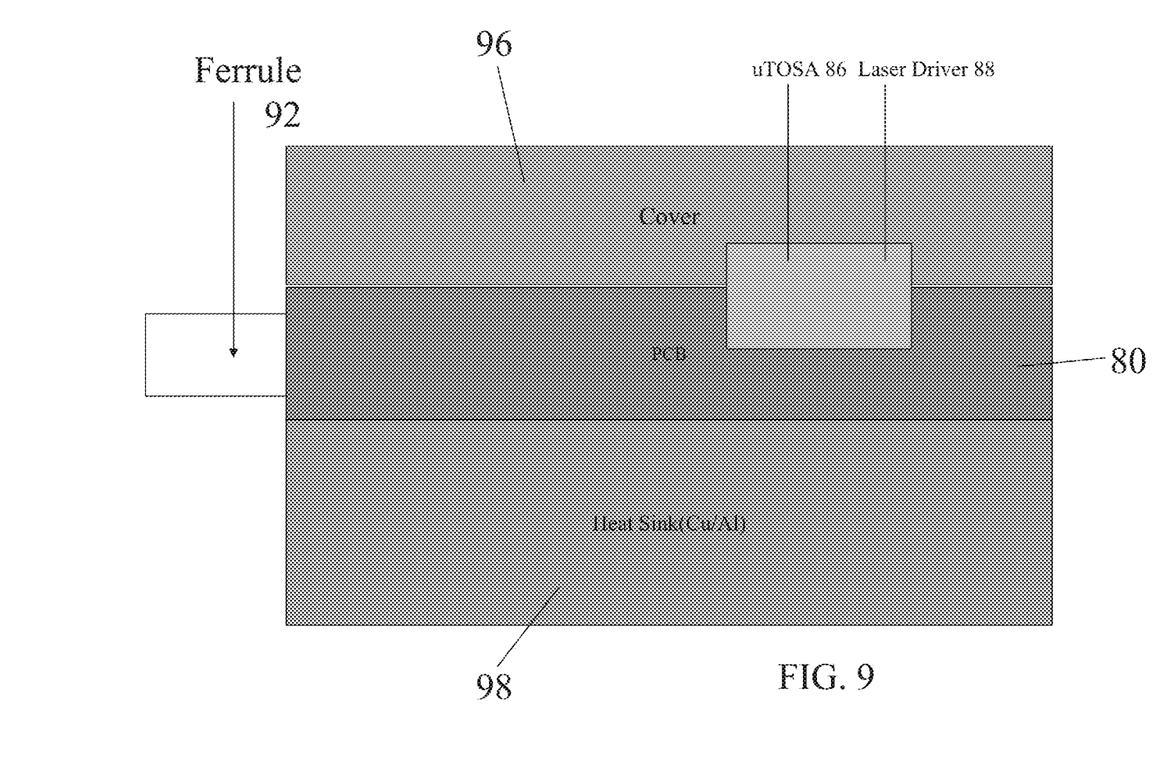
FIG. 9 is a simplified diagram showing a side view of the packaged TOSA of FIG. 8.

Reference is now made to FIG. 9, which is a simplified diagram illustrating the packaging of the optical sub-assembly of FIG. 8. Parts that are the same are given the same reference numerals. PCB 800 with μTOSA 86 and laser driver 88 is covered and sealed with cover 96. Heat sink 98, typically aluminium or copper, is placed under PCB 80 to conduct heat away from the laser diode and μTOSA. Holes may be drilled in the PCB and the silicon holders and may optionally be filled with metal to improve heat conduction.

Figure 10:
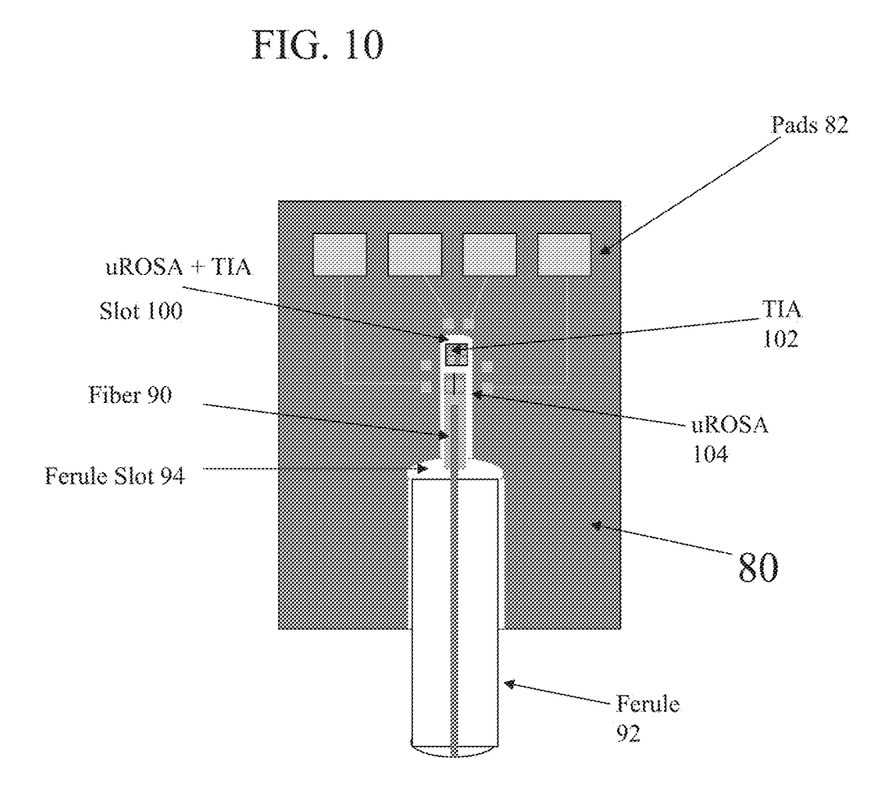
FIG. 10 is a simplified diagram illustrating a receiver optical sub-assembly (ROSA) according to an embodiment of the present invention incorporating the μROSA of FIG. 6 in a PCB.

Reference is now made to FIG. 10, which shows the ROSA PCB layout for the μROSA. Parts that are the same as in FIG. 8 are given the same reference numerals and are not described again except as necessary for an understanding of the present embodiment. PCB 80 includes slot 100 into which is inserted TIA optical receiver 102 and μROSA 104. Fiber 90 extending from ferule 92 is aligned with the v-shaped groove as before.

Figure 11:
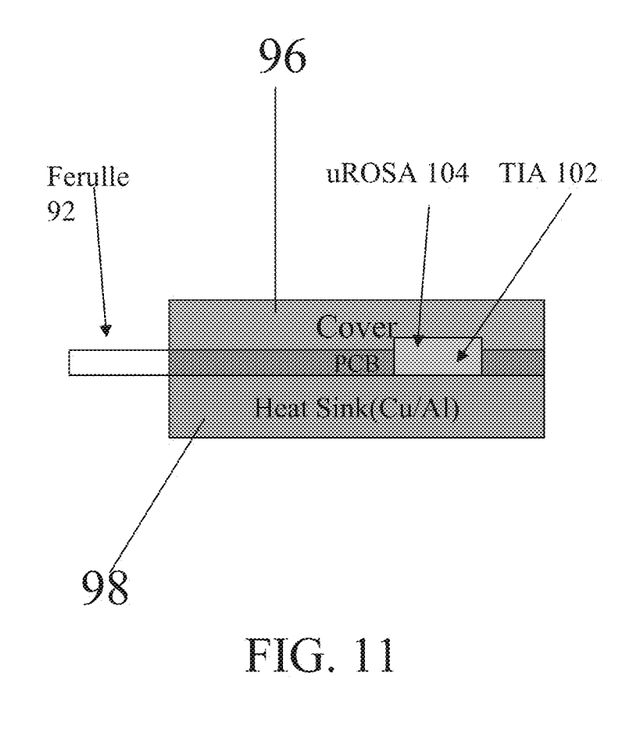
FIG. 11 is a simplified diagram illustrating a side view of the packaged ROSA of FIG. 10.

FIG. 11 illustrates the cross-section of the packaged PCB of FIG. 10. Parts that are the same as in previous figures are given the same reference numerals and are not described again as needed for an understanding of the present embodiments. the figure is in fact identical to that of FIG. 9 except that the TIA optical detector and the μROSA replace the laser driver and μTOSA.

Figure 12:
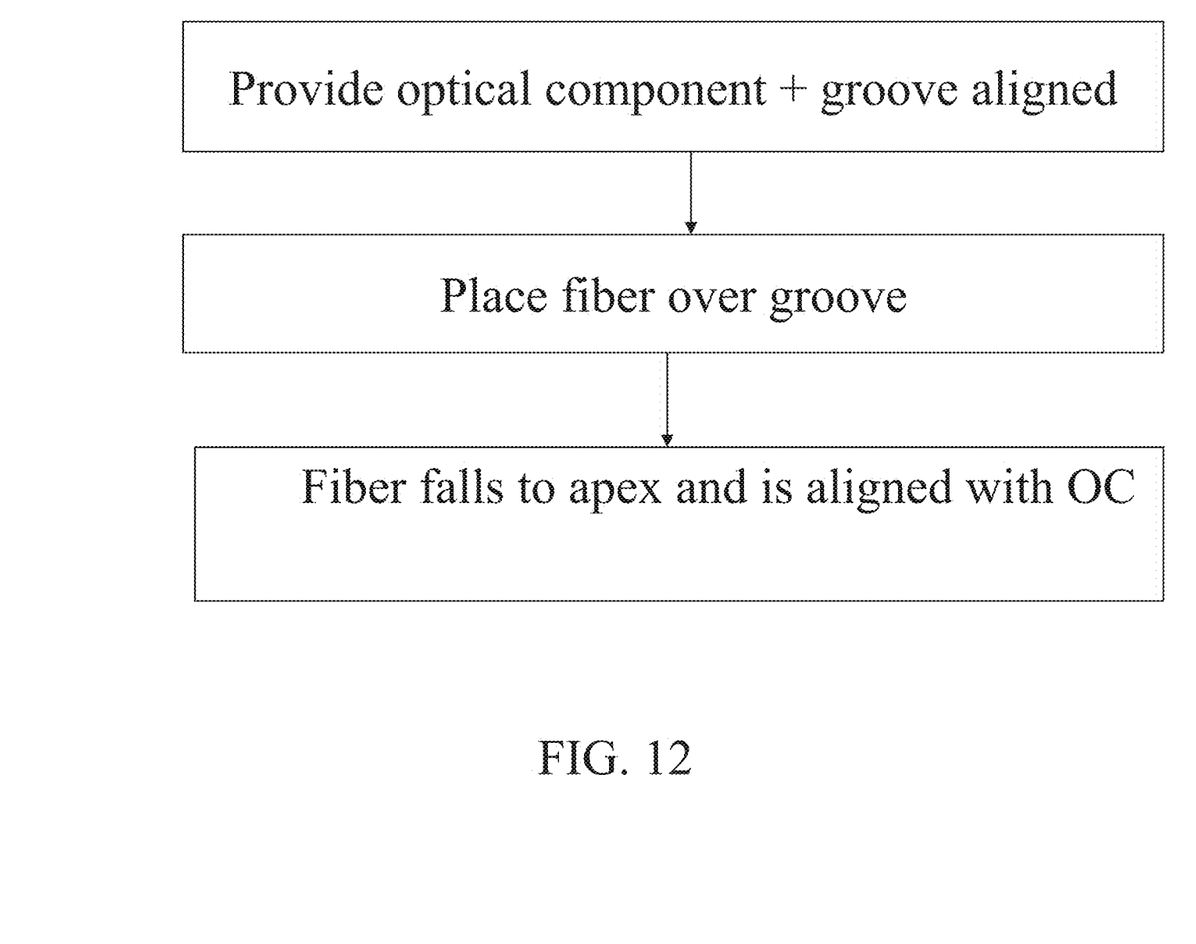
FIG. 12 is a simplified flow chart illustrating an alignment procedure for an optical fiber according to embodiments of the present invention.

Reference is now made to FIG. 12, which is a simplified diagram illustrating a method of aligning an optical fiber with an optical component in a micro-optical sub-assembly. There is initially provided a groove in the micro-sub-assembly in alignment with the optical component. The optical fiber is then placed over the groove and allowed to fall to the apex, thereby aligning the optical fiber with the optical component.

The groove may be a v-shaped groove, and alignment may involve pressing the fiber firmly into the apex. The groove may be cut into a length of silicon, and the optical component may be a laser diode or a photo-detector.

The laser diode may lase at a wavelength which is at or below 365 nm.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents, and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method of aligning an optical fiber associated with a ferrule with an optical component in a micro-optical sub-assembly, comprising:
   providing said micro-optical sub-assembly;
   providing a silicon fiber locator element on said micro-optical subassembly;
   providing a silicon fiber locator element on said micro-optical sub-assembly;
   providing a v-shaped groove on said silicon fiber locator element in said micro-optical sub-assembly, said v-shaped groove having an apex in said micro-optical sub-assembly providing a first holder;
   mounting a laser diode on said first holder in said micro-optical sub-assembly;
   aligning said laser diode with said v-shaped groove;
   providing a spacing element behind said first holder relative to said v-shaped groove, said spacing element defining a pre-determined gap;
   placing a second holder in said micro-optical sub-assembly to abut onto said spacing element;
   placing a photo-detector on a front of said second holder relative to said v-shaped groove;
   providing electrical contacts on said second holder;
   placing said micro-optical sub-assembly with said v-shaped groove in in a slot on a printed circuit board; and
   placing on said circuit board a ferrule having an optical fiber extending therefrom;
   placing said optical fiber into said apex of said v-shaped groove, the groove being in alignment with said laser diode to guide said fiber for said aligning, to an accuracy of 1 micron, thereby aligning said optical fiber with said laser diode, said optical fiber thereby extending into said ferrule from said apex for onward connection to external components.

2. The method of claim 1, wherein said groove is cut into a length of silicon of said silicon fiber locator.

3. The method of claim 1, wherein said laser diode has a wavelength which is at or below 365 nm.

\* \* \* \* \*